(12) United States Patent
Baba

(10) Patent No.: US 6,852,604 B2
(45) Date of Patent: Feb. 8, 2005

(54) MANUFACTURING METHOD OF SEMICONDUCTOR SUBSTRATE

(75) Inventor: Tomoya Baba, Ikoma (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 10/425,619

(22) Filed: Apr. 30, 2003

(65) Prior Publication Data

US 2003/0219954 A1 Nov. 27, 2003

(30) Foreign Application Priority Data

May 23, 2002 (JP) ........................................ 2002-149588

(51) Int. Cl.$^7$ ............................................. H01L 21/331
(52) U.S. Cl. ....................................... 438/373; 438/198
(58) Field of Search ................................. 438/373, 198

(56) References Cited

U.S. PATENT DOCUMENTS

| | | | | |
|---|---|---|---|---|
| 4,437,225 A | * | 3/1984 | Mizutani | ..................... 438/480 |
| 6,429,061 B1 | * | 8/2002 | Rim | ........................... 438/198 |
| 6,524,902 B2 | * | 2/2003 | Rhee et al. | .................. 438/199 |
| 6,624,017 B1 | * | 9/2003 | Lombardo et al. | .......... 438/235 |
| 6,703,688 B1 | * | 3/2004 | Fitzergald | .................... 257/616 |

OTHER PUBLICATIONS

S. Wolf, Silicon Processing for the VLSI Era, vol. 2, Lattice Press, Calif., pp. 419–426.*
Welser et al., Strain Dependence of the Performance Enhancement in Strained–Si n–MOSFETs:, IEDM 94 (IEEE), pp. 373–376.
Hargrove et al., "Quantum Mechanical Modeling of the Charge Distribution in a $Si/Si_{1-x}Ge_x/Si$ P–Channel MOSFET", IEDM 94 (IEEE), pp. 735–738.

* cited by examiner

Primary Examiner—David Nelms
Assistant Examiner—Thao P. Le
(74) Attorney, Agent, or Firm—Nixon & Vanderhye P.C.

(57) ABSTRACT

A manufacturing method of a semiconductor substrate comprising the steps of: (a) forming a SiGe layer on a substrate of which the surface is made of silicon; (b) further forming a semiconductor layer on the SiGe layer; and (c) implanting ions into regions of the SiGe layer in the substrate that become element isolation formation regions, and carrying out a heat treatment.

25 Claims, 3 Drawing Sheets

MANUFACTURING METHOD OF SEMICONDUCTOR SUBSTRATE

CROSS-REFERENCE TO RELATED APPLICATION

This application is related to Japanese Patent Application No. 2002-149588 filed on May 23, 2002, whose priority is claimed under 35 USC § 119, the disclosure of which is incorporated by reference in its entirety.

BACKGROUND OF THE INVENTION

1. Field of the Invention

The present invention relates to a manufacturing method of a semiconductor substrate. In particular, the present invention relates to a manufacturing method of a semiconductor substrate that is effective in gaining a high quality silicon substrate wherein distortion of silicon is utilized.

2. Description of Related Art

In recent years extensive research has been carried out concerning the manufacture of a high mobility transistor wherein a hetero structure is fabricated using a material having a lattice constant that is different from that of Si, that is to say, a film of a material having a lattice constant different from that of silicon substrate is grown on a silicon substrate in an epitaxial manner and, thereby, distortion due to compression or stretching in the horizontal direction is provided in the film so that the distortion is utilized in order to achieve an increase in the speed of a MOSFET (Metal Oxide Semiconductor Field Effect Transistor), in place of a conventional technology wherein a MOS interface of Si—$SiO_2$ is used as a channel.

The technology shown in FIGS. 3(a) to 3(e) is cited as an example of a manufacturing technology for a MOSFET wherein distortion is utilized.

First, as shown in FIG. 3(a), a SiGe layer 2 is grown in an epitaxial manner to have a thickness of approximately 300 nm and to have a concentration of Ge of 20 atom % on a silicon substrate 1 and a Si layer 3 is sequentially grown in an epitaxial manner to have a thickness of approximately 20 nm on the SiGe layer.

Next, as shown in FIG. 3(b), hydrogen ions are implanted into the entirety of the surface of the gained silicon substrate 1 and, after that, a heat treatment is carried out at approximately 800° C. As a result of this heat treatment, stacking faults 5 extending from micro voids 4 of hydrogen that have occurred in the vicinity of the hydrogen implantation peak reach to the interface between SiGe layer 2 and silicon substrate 1 and, furthermore, cause threading dislocations 6 in the direction of the interface. Distortion in SiGe layer 2 is relaxed due to the occurrence of these threading dislocations 6 in the direction of the interface. At this time, distortion due to stretching is generated in Si layer 3 on SiGe layer 2, wherein the distortion is relaxed and the mobility is increased in Si layer 3.

After that, as shown in FIGS. 3(c) and 3(d), the procedure passes through a conventional STI (Shallow Trench Isolation) process so that element isolation regions 11 are formed and, furthermore, as shown in FIG. 3(e), a gate insulating film 12, a gate electrode 13 and source/drain regions 14 are formed according to a general manufacturing process so that a MOSFET is completed.

According to the above described manufacturing method, however, in the case wherein the amount of implantation of hydrogen ions is sufficient to complete the relaxation of SiGe layer 2 in the step of implantation of hydrogen ions as shown in FIG. 3(b), excessive micro voids 4 of hydrogen are formed due to the subsequent heat treatment and excessive stacking faults are formed. These excessive stacking faults do not stop at the interface between SiGe layer 2 and silicon substrate 1 but cause threading dislocations 6 that reach to the surface of Si layer 3. These threading dislocations 6 caused by micro voids 4 of hydrogen are fixed by micro voids 4 of hydrogen and, therefore, it is difficult to remove threading dislocations 6 in the subsequent steps.

Thus, the amount of implantation of hydrogen ions is set at an amount of implantation lower than the amount that completely relaxes SiGe layer 2 and, thereby, prevention of the occurrence of threading dislocations 6 due to micro voids 4 of hydrogen in the subsequent heat treatment is attempted.

However, even in the case wherein the amount of implantation of hydrogen ions is set at an amount of implantation lower than the amount that completely relaxes SiGe layer 2, new occurrences of threading dislocations 6 from the interface between SiGe layer 2 and silicon substrate 1 in the subsequent heat treatment as shown in FIG. 3(b) cannot be avoided. Accordingly, the procedure passes through a conventional STI process as shown in FIGS. 3(c) and 3(d) under such conditions so that a MOSFET is fabricated and, then, many threading dislocations 6 are found beneath source/drain regions 14 as shown in FIG. 3(e) wherein the leakage current increases at the time when a reverse voltage is applied to these junctions and, therefore, there is a problem wherein a manufacturing technology for a high quality MOSFET cannot be established.

SUMMARY OF THE INVENTION

The present invention is provided in view of the above described problem and a purpose thereof is to provide a manufacturing method of a semiconductor device wherein threading dislocations 6 can be relaxed so that the junction leakage current can be restricted to the minimum even in the case wherein threading dislocations 6 occur starting from the interface between SiGe layer 2 and silicon substrate 1.

The present invention provides a manufacturing method of a semiconductor substrate comprising the steps of: (a) forming a SiGe layer on a substrate of which the surface is made of silicon; (b) further forming a semiconductor layer on the SiGe layer; and (c) implanting ions into regions of the SiGe layer in the substrate that become element isolation formation regions, and carrying out a heat treatment.

DETAILED DESCRIPTION OF THE PREFERRED EMBODIMENTS

Figure 1A:
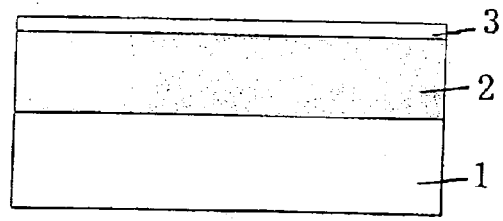
FIGS. 1(a) to 1(e) are schematic cross sectional views showing the main portion of a semiconductor substrate in the respective steps of a manufacturing method of a semiconductor substrate for describing an embodiment of the present invention.

According to the manufacturing method of a semiconductor substrate of the present invention, first, in Step (a), a SiGe layer is formed on a substrate of which the surface is made of silicon.

The substrate of which the surface is made of silicon may be a silicon substrate made of amorphous silicon, microcrystal silicon, single crystal silicon, polycrystal silicon or silicon wherein two, or more, of these crystal conditions are mixed or may be a so-called SOI substrate having such a silicon layer on the surface. In particular, a single crystal silicon substrate is preferable.

The SiGe layer can be formed according to a variety of conventional methods such as, for example, a CVD method, a sputter method, a vacuum deposition method or an MEB method. In particular, it is preferable to form the SiGe layer according to an epitaxial growth method by means of a CVD method. The film formation conditions in this case can be selected from the conditions known in the field of the art and, in particular, a film formation temperature of, for example, from 400° C. to 900° C., preferably from approximately 400° C. to 650° C., is appropriate. Concretely, it is preferable for the film formation temperature to be 500° C., or below, in the case wherein a SiGe layer is grown to have a concentration of Ge in the range described below, for example, a SiGe layer is grown to have a concentration of Ge of 30 atom %. The concentration of Ge in this SiGe layer is not specifically limited and, for example, a concentration of from approximately 10 atom % to 50 atom %, preferably, from 10 atom % to 40 atom %, more preferably, from 20 atom % to 30 atom %, can be cited. It is preferable for the SiGe layer to be a thick film so that shift dislocations at the interface between the SiGe layer and the silicon substrate that occur in a subsequent annealing step for relaxation of distortion do not negatively affect a semiconductor device, for example a MOSFET, that may be formed on top of the above. In general, the lowering of the growth temperature is effective as a technique for increasing film thickness. On the other hand, it is preferable for the film to have a film thickness that is thinner than the film thickness wherein relaxation of lattice distortion in an SiGe layer occurs when the SiGe layer is deposited on the substrate, that is to say, to have a film thickness that is thinner than the critical film thickness. Concretely, a thickness of from approximately 50 nm to 500 nm can be cited and, furthermore, a thickness of from approximately 100 nm to 500 nm is appropriate. In particular, it is preferable for the SiGe layer to have a film thickness of 300 nm, or greater, taking into consideration the formation of a PN junction in a subsequent step.

Next, in Step (b), a semiconductor layer is formed on the gained substrate. The semiconductor layer is not specifically limited as long as it has a diamond structure in the same manner as silicon. Si, Si to which C has been added or a SiGe layer having a concentration of Ge that is lower than that in the above described SiGe layer, for example, can be cited as the semiconductor layer. In particular, a silicon (Si) layer is preferable. The concentration of C in SiC is not specifically limited and a concentration of from approximately 0.1 atom % to 2 atom %, for example, can be cited. In addition, it is appropriate for the concentration of Ge in the SiGe to be approximately 10 atom %, or less. The semiconductor layer can be formed according to the same method as is the SiGe layer and it is preferable for the semiconductor layer to be formed within the same device after the formation of the SiGe layer by, for example, switching the growth gases. Thereby, oxygen pollution, or the like, on the surface of the SiGe layer can be reduced. It is preferable for the temperature of the substrate in this case to be from approximately 400° C. to 650° C. It is preferable for the film thickness of the semiconductor layer to be a thick film, taking into consideration the reduction in the film thickness in subsequent manufacturing steps for the semiconductor device as well as diffusion of Ge from the SiGe layer, and the like, while it is preferable for the semiconductor layer to be formed so as to have a film thickness less than the critical film thickness in order to suppress the occurrence of defects on the Si layer caused by distortion due to stretching after the step of relaxation of distortion of the SiGe layer. Here, it is preferable wherein the higher is the concentration of germanium in the SiGe layer, the thinner is the semiconductor layer, and wherein the higher is the heat treatment temperature in the manufacturing process for the semiconductor device subsequently carried out, the thinner is the semiconductor layer. Concretely, the film thickness is from approximately 1 nm to 100 nm and, more preferably, from approximately 5 nm to 30 nm, and, in particular, it is appropriate for the film thickness to be approximately 20 nm, or less, in the case wherein the semiconductor layer is formed on a SiGe layer having a concentration of Ge of 30 atom % and it is appropriate for the film thickness to be approximately 50 nm, or less, in the case of a concentration of Ge of 20 atom %.

Here, it is preferable to implant ions into the gained substrate and to carry out a heat treatment after the formation of the SiGe layer and after the formation of the semiconductor layer. It is appropriate to carry out ion implantation using elements that can introduce lattice defects in the surface of the utilized silicon substrate as well as elements that can create micro cavities in the silicon substrate as a result of annealing after ion implantation, or the like, and such elements can be selected from the group consisting of hydrogen, inert gases and elements of group IV. Concretely, hydrogen, helium, neon, silicon, carbon, germanium, and the like can be cited as such elements and, in particular, hydrogen is preferable. The acceleration energy for ion implantation can be appropriately adjusted depending on the type of used ions, the film thickness of the SiGe layer, the material and film thickness of the semiconductor layer, and the like. It is desirable to set the acceleration energy at a value, for example, wherein the implantation peak is located at a position in the silicon substrate in the vicinity of the interface between the SiGe layer and the substrate and, more concretely, wherein the peak is located at a depth of approximately 20 nm, or greater, (preferably at a depth of from approximately 30 nm to 70 nm) in the substrate from the interface in order to prevent defects in the SiGe layer and in order to prevent the SiGe layer from becoming a thin film. A value of from approximately 20 keV to 150 keV, preferably from approximately 30 keV to 35 keV, can be cited as the implantation energy and, more concretely, a value of from approximately 18 keV to 25 keV can be cited as the implantation energy in the case wherein the SiGe layer has a film thickness of approximately 200 nm and wherein hydrogen is used. A dose value of approximately $2 \times 10^{16}$ $cm^{-2}$, or less, can be cited.

Furnace annealing, lamp annealing, RTA, and the like, for example, can be cited as types of annealing that can be carried out in an inert gas atmosphere, in a standard atmosphere, in a nitrogen gas atmosphere, in an oxygen gas atmosphere, in a hydrogen gas atmosphere, or the like, at a temperature in a range of from 600° C. to 900° C. for from approximately 10 minutes to 30 minutes.

Furthermore, in Step (c), ions are implanted into regions of the SiGe layer on the substrate that become element isolation formation regions and a heat treatment is carried out. Here, the implanted ions can be selected, for example, from the group comprising of hydrogen, inert gases and elements of groups II to V. Concretely, ions of hydrogen, helium, neon, silicon, carbon, germanium, arsenic, phosphorous, boron, and the like, can be cited and, in particular, silicon ions, germanium ions, arsenic ions, and the like, are preferable wherein silicon ions are more preferable. The acceleration energy for ion implantation can be appropriately adjusted depending on the type of used ions, the film thickness of the SiGe layer, the material and film thickness of the semiconductor layer, and the like. It is preferable to set the acceleration energy, for example, at a value wherein the implantation peak is located in an upper portion of the SiGe layer and, more concretely, wherein the peak is located at a position of the SiGe layer approximately 20 nm above the interface. A value of from approximately 20 keV to 150 keV, for example, can be cited as the implantation energy. A dose value of approximately $1\times10^{15}$ cm$^{-2}$, or greater, for example, can be cited.

Here, it is preferable to create trenches, of which the bottoms are located in the SiGe layer, in regions that become element isolation formation regions before the ion implantation in the above step so that ions are implanted into the bottoms of these trenches. Trenches can be created according to a well-known photolithographic and etching process. Here, etching may be by anisotropic or isotropic etching or by dry or wet etching, and anisotropic etching is preferable. The size and form of trenches are not specifically limited and can be appropriately adjusted in accordance with the design of the semiconductor device that is desired to be gained. The depth of trenches can be appropriately adjusted depending on the film thickness, or the like, of the SiGe layer and a depth of from approximately 200 nm to 450 nm can be cited. Here, in the case of creation of trenches, it is preferable to carry out ion implantation so that the implantation peak of ions is located in the vicinity of the bottoms of the trenches and, therefore, it is necessary to set the acceleration energy for ion implantation at a value of from approximately 20 keV to 60 keV.

The heat treatment can be carried out according to the same method as described above. In particular, it is preferable for the temperature to be set at from approximately 550° C. to 650° C.

In the following, a manufacturing method of a semiconductor device according to the present invention is described in detail in reference to FIGS. 1(a) to 1(e).

According to the manufacturing method of a semiconductor device of the present invention, first, as shown in FIG. 1(a), SiGe layer 2 is grown in an epitaxial manner to have a thickness of approximately 300 nm and to have a concentration of Ge of 30 atom % using a well-known CVD (Chemical Vapor Deposition) method at a temperature of from 400° C. to 900° C. in an atmosphere of a mixed gas of SiH$_4$ and GeH$_4$ diluted with a hydrogen gas on the surface of a p type Si single crystal substrate (hereinafter referred to as silicon substrate 1) in the plane direction (100) having a concentration of doped boron of approximately $1\times10^{15}$ cm$^{-3}$ that is used in a conventional Si manufacturing process. Then, Si semiconductor layer 3 is grown in an epitaxial manner to have a thickness of approximately 20 nm on SiGe layer 2 using a CVD method at a temperature of from 400° C. to 900° C. wherein the growth gas is switched to a SiH$_4$ gas diluted with a hydrogen gas utilizing the same manufacturing unit.

Figure 1B:
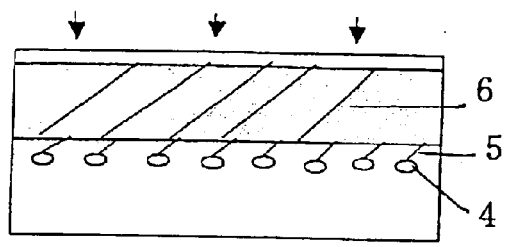

Next, as shown in FIG. 1(b), a dose of hydrogen ions of $2\times10^{16}$ cm$^{-2}$, or less, is implanted using an implantation energy of from 30 keV to 35 keV and, after that, a heat treatment is carried out at a temperature of 600° C., or higher.

As a result of this heat treatment the implanted hydrogen ions grow to become micro voids 4 and stacking faults (dislocations) 5 grow around the voids, which serve as nuclei, so as to cause a shift at the interface between SiGe layer 2 and silicon substrate 1 and, thereby, distortion of SiGe layer 2 is relaxed. Here, the positions wherein micro voids 4 of the hydrogen ions are created correspond to the position of the implantation peak and threading dislocations 6, which have reached to the inner surfaces of the stacking faults that have occurred due to a factor other than the hydrogen at this time, are thermodynamically stable and remain until the final step, in the case wherein there are no elimination sites, so as to cause leakage from a PN junction and, therefore, it is necessary to reduce such threading dislocations.

Figure 1C:
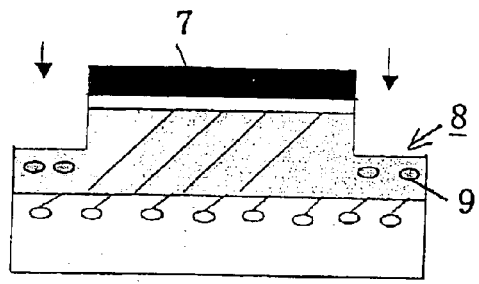

Then, as shown in FIG. 1(c), a well-known photolithographic technology is used to form a resist pattern 7 for the formation of element isolation regions and this resist pattern (resist as an etching mask) 7 is used to etch SiGe layer 2 and Si layer 3 to a depth of 350 nm by means of a well-known RIE (Reactive Ion Etching) method using a SF$_6$ gas and, thereby, trenches 8 for element isolation are created. After that, a dose of Si ions of $1\times10^{15}$ cm$^{-2}$ is implanted into the bottoms of trenches 8 for element isolation using an implantation energy of 40 KeV by means of a well-known ion implantation method. After that, a heat treatment is carried out at the comparatively low temperature of approximately 600° C. and, thereby, stacking faults 9 are created in the bottoms of trenches 8 for element isolation.

Here, it is necessary for the amount of the implantation of the Si ions to be $1\times10^{15}$ cm$^{-2}$, or greater, in order to convert SiGe layer 2 into an amorphous layer and the conditions concerning the implantation energy are selected so that the implantation peak is 20 nm, or greater, in order to form nuclei of stacking faults. The annealing temperature is set at 600° C. in the case of utilization of SiGe so that recovery from damage can progress and nuclei can be formed.

Figure 1D:
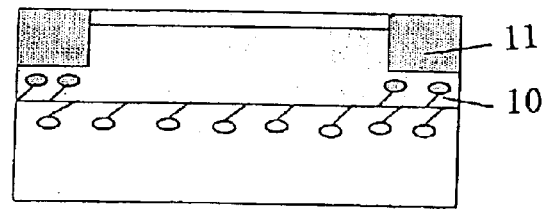

After that, as shown in FIG. 1(d), trenches 8 for element isolation are filled in with SiO$_2$, which is formed of a SiH$_4$ gas and an O$_2$ gas by means of a well-known CVD method and, then, flattening is carried out by removing the SiO$_2$ film from regions other than the element isolation regions by means of a well-known CMP (Chemical Mechanical Polishing) method so that element isolation regions 11 are formed.

A SiO$_2$ film may be formed by means of the well-known CVD method and, next, a SiN film may be formed in an atmosphere of SiH$_4$ and NH$_3$ by means of the well-known CVD method after the step of FIG. 1(b) in order to increase the process margin for the etching of the SiO$_2$ according to the above described CMP method. The SiN film is used to stop the etching at the time of the CMP.

Next, a heat treatment is carried out at a temperature of from 800° C. to 1000° C. Thereby, the threading dislocations 6 in the active regions in FIG. 1(c) can be shifted towards stacking faults 9 created in FIG. 1(d) so as to be trapped in stacking faults 9. These trapped dislocations 10 are thermally stable and are not released again as a result of the heat treatment at a temperature of 1000° C., or below, that is subsequently carried out in the Si manufacturing process.

Figure 1E:
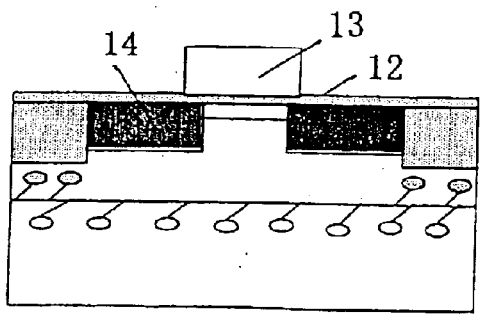

Next, as shown in FIG. 1(e), a gate insulating film 12, a gate electrode made of an N type polycrystal Si film and N type source/drain regions 14 are formed according to a well-known MOSFET manufacturing technology so that the MOSFET is completed.

Figure 2:
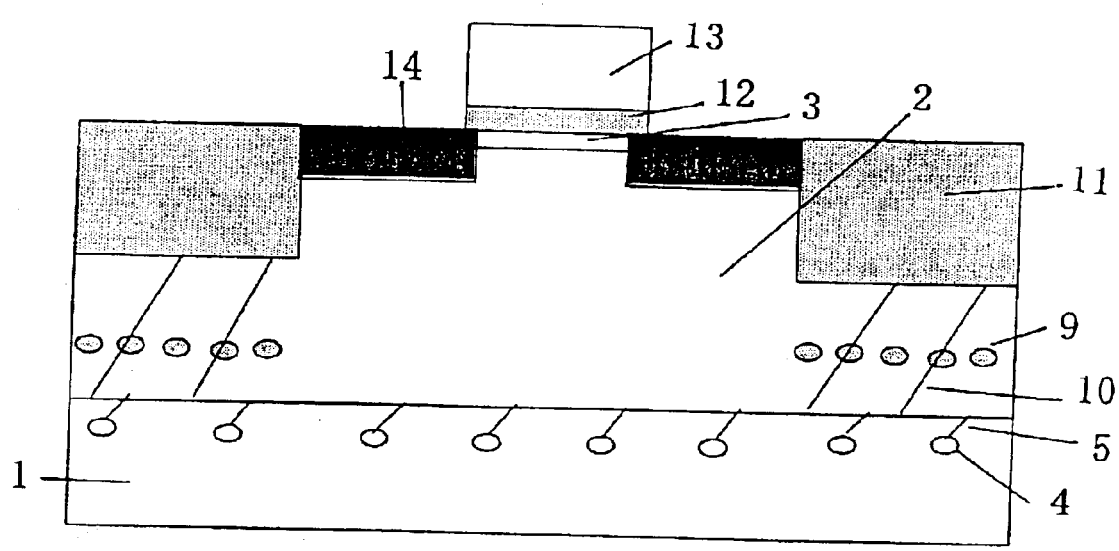
FIG. 2 is a schematic cross sectional view showing the main portion of a semiconductor device that utilizes a semiconductor substrate gained according to the methods of FIGS. 1(a) to 1(e)
Figure 3A:
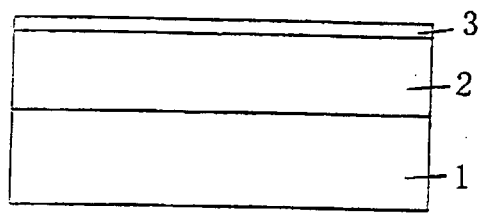
FIGS. 3(a) to 3(e) are schematic cross sectional views showing the main portion of a semiconductor device in the respective steps for describing a manufacturing method of a semiconductor device according to a prior art.
Figure 3B:
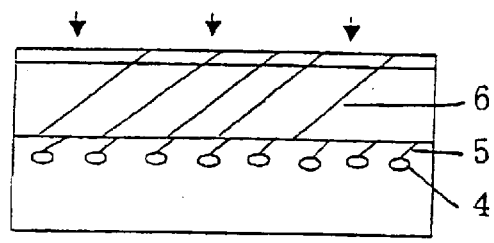
Figure 3C:
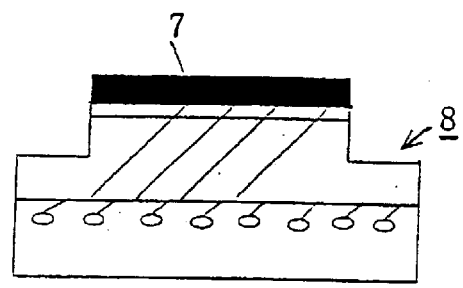
Figure 3D:
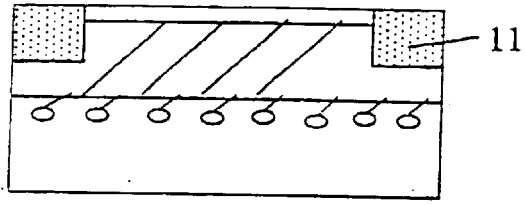
Figure 3E:
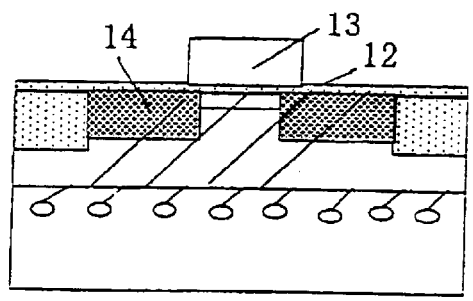

SiGe layer 2, which has a thickness of 300 nm, and Si layer 3, which has a thickness of 20 nm, are formed on silicon substrate 1, into which a p type impurity of approximately $1\times10^{15}$ cm$^{-2}$ has been doped, and gate electrode 13 is formed above the Si layer with gate insulating film 12 intervened in the semiconductor device manufactured in the above described manner, as shown in FIG. 2. Source/drain regions 14 are formed on both sides of gate electrode 13 and a channel region is formed in SiGe layer 2 directly beneath gate electrode 13 between source/drain regions 14. This semiconductor device is isolated from other elements by means of trench-type element isolation regions 11.

In addition, micro voids 4 are created at a depth of approximately 50 nm from the interface between SiGe layer 2 and silicon substrate 1 and stacking faults (dislocations) 5 that develop from these micro voids 4 extend to the interface between SiGe layer 2 and silicon substrate 1 so as to relax the majority of the distortion in SiGe layer 2.

Furthermore, stacking faults 9 are created beneath element isolation regions 11 wherein dislocations 10 occurring due to the relaxation of the distortion in SiGe layer 2 are captured by these stacking faults 9.

Thereby, threading dislocations 6, which have occurred in a region of SiGe layer 2 wherein the MOS transistor is formed, are shifted toward stacking faults 9 so as to be captured by stacking faults 9 and, as a result, almost no defects are found in the region wherein the MOS transistor is formed. That is to say, the number defects in the active region of SiGe layer 2 can be reduced by utilizing the stacking faults created by means of ion implantation into SiGe layer 2 beneath element isolation regions 11.

As described above according to the present invention, relaxation of the distortion at the interface between the silicon substrate and the SiGe layer is promoted and, at the same time, stacking faults that occur due to shift at the SiGe/Si interface can be prevented by utilizing the stacking faults that develop from microscopic defects by means of a heat treatment after the relaxation of distortion due to hydrogen ion implantation.

However, in the case wherein an excessive number of stacking faults have developed from microscopic defects, created due to hydrogen ion implantation, these stacking faults become the cause of the occurrence of defects in the SiGe layer. It is necessary to create an excessive number of microscopic defects, due to ion implantation, in order to completely relax the distortion in the SiGe layer and, thereby, dislocations occur in the SiGe layer.

Thus, an amount of ions smaller than an amount that will completely relax the SiGe layer is implanted and a heat treatment is carried out so that stacking faults that have developed from the interface between the SiGe layer and the silicon layer also partially relax the SiGe layer. In this case, the stacking faults that have developed from the interface between the SiGe layer and the silicon layer and that have reached the surface shift in a thermally random manner in the direction perpendicular to the surface of the substrate when the temperature is raised. Therefore, according to the present invention, the stacking faults are shifted toward the element isolation regions that cover the periphery of a normally active region so that dislocations are erased therein.

Therefore, an excessive amount of silicon ions is introduced into the silicon substrate by means of an ion implantation method so that stacking faults that occur at the time when a device is formed at a comparatively low temperature are utilized. The dislocations that have once been captured by these stacking faults are converted to a stable condition with respect to energy and, therefore, most of these dislocations do not shift toward the active region during heat treatment in a conventional manufacturing process for a transistor and, therefore, no problems are caused.

Accordingly, defects that may lead to junction leakage during the electrical operation of a MOS transistor are eliminated and a MOS transistor with excellent characteristics can be implemented.

According to the present invention, dislocations in an active region, which cause problems in the case wherein a high speed MOSFET is formed using a provisional substrate including SiGe, are trapped beneath element isolation regions so that the active region is not negatively affected and, thereby, a semiconductor substrate can be manufactured wherein junction leakage, which has conventionally been problematic, can be greatly reduced. It becomes possible by utilizing such a semiconductor substrate to implement a high speed LSI that requires a low consumption of power and that cannot conventionally be manufactured using distorted Si.

What is claimed is:

1. A manufacturing method of a semiconductor substrate comprising the steps of:
   (a) forming a SiGe layer on a substrate of which the surface is made of silicon;
   (b) further forming a semiconductor layer on the SiGe layer; and
   (c) forming spaced apart trenches in the SiGe layer, and after the trenches have been formed implanting ions into bottoms of the trenches in the SiGe layer that become element isolation formation regions, and carrying out a heat treatment following said implanting.

2. The method according to claim 1, wherein the ions implanted in step (c) are selected from the group consisting of hydrogen, inert gases and elements of groups II to V and the dose of the ions is $1\times10^{15}$ cm$^{-2}$, or greater.

3. The method according to claim 1, wherein the ions implanted in step (c) are silicon ions, germanium ions or arsenic ions.

4. The method according to claim 1, wherein the ions are implanted into the bottoms of the trenches in step (c) but are not implanted into active regions of the SiGe layer which are to form source and/or drain regions of a transistor between the trenches.

5. The method according to claim 1, wherein the SiGe layer is formed so as to have a concentration of Ge of from 10 atom % to 50 atom % and so as to have a film thickness of from 50 nm to 500 nm.

6. The method according to claim 1, wherein the semiconductor layer is a SiGe layer with a concentration of Ge lower than the Ge concentration of the SiGe layer.

7. The method according to claim 1, wherein the semiconductor substrate is used for a MOS transistor.

8. A manufacturing method of a semiconductor substrate comprising:
   (a) forming a layer comprising SiGe on a substrate of which the surface comprises silicon; (b) further forming a semiconductor layer on the layer comprising SiGe; (c) forming spaced apart trenches in the layer comprising SiGe and after forming the trenches implanting ions into bottoms of the trenches in the layer comprising SiGe which become element isolation formation regions and thereafter carrying out a heat treatment; and (d) implanting ions into the substrate and carrying out a heat treatment, wherein step (d) is carried out after steps (a) and (b) and before step (c).

9. The method according to claim 8, wherein the ions implanted in step (c) are selected from the group consisting of hydrogen, inert gases and elements of groups II to V and the dose of the ions is $1\times10^{15}$ cm$^{-2}$, or greater.

10. The method according to claim 8, wherein the ions implanted in step (c) are silicon ions, germanium ions or arsenic ions.

11. The method according to claim 8, wherein the ions are implanted into the bottoms of the trenches in step (c) but are not implanted into active regions of the SiGe layer which are to form source and/or drain regions of a transistor between the trenches.

12. The method according to claim 8, wherein the ions implanted in step (d) are selected from the group consisting of hydrogen, inert gases and elements of group IV and the dose of the ions is $2\times10^{16}$ cm$^{-2}$, or less.

13. The method according to claim 12, wherein the ions are hydrogen ions, helium ions, neon ions, silicon ions, carbon ions or germanium ions.

14. The method according to claim 8, wherein the ion implantation of step (d) is carried out by adjusting the acceleration energy so that the implantation peak is located at a position in the silicon substrate in the vicinity of the SiGe/substrate interface.

15. The method according to claim 8, wherein the ion implantation of step (d) is carried out by adjusting the acceleration energy so that the implantation peak is located at a depth of 20 nm, or greater, in the substrate from the interface between the layer comprising SiGe and the substrate.

16. The method according to claim 8, wherein the amount of ions implanted in step (d) is smaller than the amount that allows SiGe to be completely relaxed.

17. The method according to claim 8, wherein the layer comprising SiGe is formed so as to have a concentration of Ge of from 10 atom % to 50 atom % and so as to have a film thickness of from 50 nm to 500 nm.

18. The method according to claim 8, wherein the semiconductor layer is a SiGe layer with a concentration of Ge lower than the Ge concentration of the layer comprising SiGe.

19. The method according to claim 8, wherein the semiconductor substrate is used for a MOS transistor.

20. A manufacturing method of a semiconductor substrate comprising:

(a) forming a layer comprising SiGe on a substrate comprising silicon; (b) further forming a semiconductor layer on the layer comprising SiGe; (c) implanting ions into regions of the layer comprising SiGe in the substrate which become element isolation formation regions and carrying out a heat treatment; and (d') implanting ions that can create micro cavities into the substrate and carrying out a heat treatment, wherein step (d') is carried out after steps (a) and (b) and before step (c), and trenches of which the bottoms are located in the layer comprising SiGe are created in the regions that become the element isolation formation regions before the ion implantation of step (c) so that silicon ions are implanted in the bottoms of the trenches in step (c).

21. A method of making a semiconductor device including an isolation region, the method comprising:

providing a substrate;

forming a layer comprising SiGe so as to be supported by the substrate;

forming a semiconductor layer on the substrate over the layer comprising SiGe;

forming a trench in the layer comprising SiGe;

after forming the trench, implanting ions into a bottom portion of the trench in the layer comprising SiGe; and at least partially filling the trench with an insulator to form the isolation region.

22. The method according to claim 21, wherein the ions are selected from the group consisting of hydrogen, inert gases and elements of groups II to V and the dose of the ions is $1\times10^{15}$ cm$^{-2}$, or greater.

23. The method according to claim 21, wherein the ions are silicon ions, germanium ions or arsenic ions.

24. The method according to claim 21, wherein the layer comprising SiGe is formed so as to have a concentration of Ge of from 10 atom % to 50 atom % and so as to have a film thickness of from 50 nm to 500 nm.

25. The method according to claim 21, providing first and second of the trenches, and forming a transistor on the substrate between first and second trenches.

* * * * *